United States Patent
Nam et al.

(10) Patent No.: US 7,646,067 B2
(45) Date of Patent: Jan. 12, 2010

(54) COMPLEMENTARY METAL-OXIDE-SEMICONDUCTOR TRANSISTOR INCLUDING MULTIPLE GATE CONDUCTIVE LAYERS AND METHOD OF MANUFACTURING THE SAME

(75) Inventors: Gab-Jin Nam, Seoul (KR); Myoung-Bum Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/891,337

(22) Filed: Aug. 10, 2007

(65) Prior Publication Data

US 2008/0042213 A1 Feb. 21, 2008

(30) Foreign Application Priority Data

Aug. 21, 2006 (KR) .................. 10-2006-0078730

(51) Int. Cl.
  *H01L 29/76* (2006.01)
  *H01L 29/94* (2006.01)
  *H01L 31/062* (2006.01)
  *H01L 31/113* (2006.01)
  *H01L 31/119* (2006.01)
  *H01L 27/01* (2006.01)
  *H01L 27/12* (2006.01)
  *H01L 23/62* (2006.01)

(52) U.S. Cl. .............. 257/369; 257/338; 257/350; 257/351; 257/357; 257/358; 257/359; 257/371; 257/407; 257/914; 257/E27.062; 257/E27.108

(58) Field of Classification Search ............. 257/338, 257/350–351, 357–359, 369, 371, 407, 914, 257/E27.062, E27.108

See application file for complete search history.

(56) References Cited

U.S. PATENT DOCUMENTS

| | | | | | |
|---|---|---|---|---|---|
| 5,807,778 | A | * | 9/1998 | Lee | 438/257 |
| 5,903,053 | A | * | 5/1999 | Iijima et al. | 257/751 |
| 5,933,721 | A | * | 8/1999 | Hause et al. | 438/217 |
| 6,027,961 | A | * | 2/2000 | Maiti et al. | 438/199 |
| 6,252,283 | B1 | * | 6/2001 | Gardner et al. | 257/407 |
| 6,486,506 | B1 | * | 11/2002 | Park et al. | 257/314 |
| 6,521,527 | B1 | * | 2/2003 | Kuroi et al. | 438/652 |
| 6,537,901 | B2 | * | 3/2003 | Cha et al. | 438/592 |
| 6,583,004 | B2 | * | 6/2003 | Kim | 438/241 |
| 6,902,969 | B2 | * | 6/2005 | Adetutu et al. | 438/199 |

(Continued)

FOREIGN PATENT DOCUMENTS

KR 10-2004-0006472 1/2004

(Continued)

*Primary Examiner*—Ida M Soward
(74) *Attorney, Agent, or Firm*—Mills & Onello, LLP

(57) ABSTRACT

A CMOS transistor and a method of manufacturing the CMOS transistor are disclosed. An NMOS transistor is formed on a first region of a semiconductor substrate. A PMOS transistor is formed on a second region of a semiconductor substrate. The NMOS transistor includes a first gate conductive layer. The PMOS transistor includes a second gate conductive layer. The first gate conductive layer includes a metal having a nitrogen concentration increasing in a direction from a lower portion toward an upper portion. In addition, the metal has a work function of about 4.0 eV to about 4.3 eV. The third gate conductive layer includes a metal having a nitrogen concentration increasing in a direction from a lower portion toward an upper portion. In addition, the metal has a work function of about 4.7 eV to about 5.0 eV.

4 Claims, 7 Drawing Sheets

U.S. PATENT DOCUMENTS

| | | | |
|---|---|---|---|
| 6,953,728 B2* | 10/2005 | Murakami et al. | 438/275 |
| 7,023,064 B2* | 4/2006 | Park et al. | 257/412 |
| 7,056,776 B2* | 6/2006 | Park et al. | 438/157 |
| 7,084,015 B2* | 8/2006 | Nguyen | 438/142 |
| 7,259,060 B2* | 8/2007 | Amon et al. | 438/243 |
| 7,332,388 B2* | 2/2008 | Trivedi et al. | 438/199 |
| 7,352,026 B2* | 4/2008 | Park et al. | 257/315 |
| 7,524,707 B2* | 4/2009 | Adetutu et al. | 438/150 |
| 7,534,681 B2* | 5/2009 | Aritome | 438/257 |
| 2001/0019868 A1* | 9/2001 | Gonzalez et al. | 438/275 |
| 2004/0115874 A1* | 6/2004 | Amon et al. | 438/200 |
| 2006/0011949 A1 | 1/2006 | Yang et al. | |
| 2006/0170047 A1* | 8/2006 | Ishimaru | 257/347 |
| 2007/0034964 A1* | 2/2007 | Park et al. | 257/369 |
| 2007/0155105 A1* | 7/2007 | Seo et al. | 438/283 |

FOREIGN PATENT DOCUMENTS

KR  10-2004-0060290  7/2004

* cited by examiner

COMPLEMENTARY METAL-OXIDE-SEMICONDUCTOR TRANSISTOR INCLUDING MULTIPLE GATE CONDUCTIVE LAYERS AND METHOD OF MANUFACTURING THE SAME

CROSS-REFERENCE TO RELATED APPLICATION

This application claims priority under 35 USC §119 to Korean Patent Application No. 10-2006-0078730 filed on Aug. 21, 2006, the disclosure of which is herein incorporated by reference in its entirety.

BACKGROUND OF THE INVENTION

1. Field of the Invention

The present invention relates to a complementary metal-oxide-semiconductor (CMOS) transistor and a method of manufacturing the CMOS transistor. More particularly, the present invention relates to a CMOS transistor employing metal having a desired work function for a gate pattern of the CMOS transistor and a method of manufacturing the CMOS transistor.

2. Description of the Related Art

Recently, a gate insulating layer of a complementary metal-oxide-semiconductor (CMOS) transistor is required not only to maintain a thin equivalent oxide thickness (EOT), but also to sufficiently reduce a leakage current generated between a gate conductive layer and a channel region. Accordingly, a material having a high dielectric constant has been used for the gate insulating layer of the CMOS transistor.

However, when a gate conductive layer including polysilicon is formed on the gate insulating layer including the material having a high dielectric constant, a Fermi-level pining phenomenon is frequently generated. As a result, a behavior of impurities is impeded by the above phenomenon and, thus, a flat band voltage represented by a proportional function of a threshold voltage is not efficiently controlled.

However, research results concerning a formation of the gate conductive layer using a metal to sufficiently reduce the Fermi-level pining phenomenon have been reported recently. The gate conductive layer including the metal sufficiently prevents an increase in the EOT due to a poly-depletion effect frequently generated at the gate conductive layer formed from polysilicon.

Accordingly, the gate pattern of the CMOS transistor has a structure including the gate insulating layer and the gate conductive layer. The gate insulating layer includes the material having the high dielectric constant. The gate conductive layer includes the metal. Here, the metal used for the gate conductive layer includes a metal for adjusting a work function and another metal used for an upper electrical line.

In addition, the CMOS transistor includes an n-typed metal-oxide-semiconductor (NMOS) transistor and a p-typed metal-oxide-semiconductor (PMOS) transistor. Here, a work function of the metal used for the NMOS transistor and a work function of another metal used for the PMOS transistor need to be different from each other.

Accordingly, the metal having the work function of about 4.0 eV to about 4.3 eV is used for a gate pattern in the NMOS transistor. The metal having the work function of about 4.7 eV to about 5.0 eV is used for a gate pattern in the PMOS transistor. This is because when the metal having the work function of about 4.0 eV to about 4.3 eV is used for a gate pattern in the NMOS transistor, the threshold voltage is effectively controlled. Similarly, this is because when the metal having the work function of about 4.7 eV to about 5.0 eV is used for a gate pattern in the PMOS transistor, the threshold voltage is effectively controlled.

To form each source/drain of the NMOS transistor and the PMOS transistor, impurities are implanted at a surface of a semiconductor substrate. A thermal treatment is then performed to activate behavior of the impurities. Here, the thermal treatment is performed at a high temperature of about 1,000° C.

However, when the thermal treatment is performed, the work function of the metal used for the gate conductive layer in the CMOS transistor is frequently changed. All of the metal having the work function of about 4.0 eV to about 4.3 eV in the NMOS transistor and the metal having the work function of about 4.7 eV to about 5.0 eV in the PMOS transistor are changed into a state having a work function of about 4.5 eV after the thermal treatment is performed. This is because the metal adjusting the work function that is used for the gate conductive layers of the NMOS transistor and the PMOS transistor is easily reacted with the metal used for the electrical line during the thermal treatment.

When the work function of the metal used for the gate conductive layer is changed to an undesired value, it becomes difficult to control the threshold voltage. In addition, the thermal treatment for activating the behavior of the impurities may not be omitted in manufacturing process of the CMOS transistor. Thus, there are limits to use the metal having an adequate work function for the gate conductive layer of the CMOS transistor.

SUMMARY OF THE INVENTION

In accordance with the present invention, there is provided a complementary metal-oxide-semiconductor (CMOS) transistor including a metal to sufficiently maintain a work function characteristic.

Also in accordance with the present invention, there is provided a method of manufacturing the CMOS transistor.

In accordance with one aspect of the present invention, provided is a complementary metal-oxide-semiconductor (CMOS) transistor that includes a semiconductor substrate having a first region and a second region, an n-typed metal-oxide-semiconductor (NMOS) transistor formed at the first region of the semiconductor substrate and a p-typed metal-oxide-semiconductor (PMOS) transistor formed at the second region of the semiconductor substrate. The NMOS transistor includes a first source/drain pair, a first channel region, and a first gate pattern. The first source/drain pair is formed at a surface of the semiconductor substrate and is doped with n-typed impurities. The first channel region is formed at a surface portion of the semiconductor substrate located between a source and a drain of the first source/drain pair. The first gate pattern is formed on the first channel region and includes a first gate insulating layer, a first gate conductive layer, and a second gate conductive layer. The first gate conductive layer includes a metal having a nitrogen concentration increasing in a lower portion toward an upper portion, the metal having a work function of about 4.0 eV to about 4.3 eV. The second gate conductive layer includes a material having an electrical resistance lower than that of the first gate conductive layer. The PMOS transistor includes a second source/drain pair, a second channel region, and a second gate pattern. The second source/drain pair is formed at a surface of the semiconductor substrate and is doped with n-typed impurities. The second channel region is formed at a surface portion of the semiconductor substrate located between a source and a drain of the second source/drain pair. The second gate pattern is formed on the second channel region and includes a second gate insulating layer, a third gate conductive layer, and a fourth gate conductive layer. The third gate conductive layer includes a metal having a nitrogen concentration increasing in a direction from a lower portion toward an upper portion, the metal having a work function of about 4.7 eV to about 5.0 eV. The fourth gate conductive layer includes a material having an electrical resistance lower than that of the third gate conductive layer.

The first source/drain pair may comprise phosphorus or arsenic and the second source/drain pair may comprise boron.

The first gate conductive layer may be formed using at least one metal selected from a group consisting of tantalum, tungsten, nickel, molybdenum, tantalum silicon, tungsten silicon, titanium silicon, molybdenum silicon and nickel silicon such that the work function of the first gate conductive layer becomes about 4.0 eV to about 4.3 eV. And the second gate conductive layer may be formed using at least one metal selected from a group consisting of titanium, titanium nitride, tungsten, nickel, tungsten silicon, titanium silicon, molybdenum silicon, nickel silicon, ruthenium, ruthenium oxide, iridium, iridium oxide and platinum such that the work function of the second gate conductive layer becomes about 4.7 eV to about 5.0 eV.

The first gate conductive layer may have a double-layered structure, including a lower first gate conductive layer formed on the first gate insulating layer and an upper first gate conductive layer formed on the lower first gate conductive layer, the lower first gate conductive layer being formed using a metal that does not include nitrogen, the upper first gate conductive layer being formed using a metal that includes nitrogen. And the third gate conductive layer may have a double-layered structure, including a lower third gate conductive layer formed on the second gate insulating layer and an upper third gate conductive layer formed on the lower second gate conductive layer, the lower third gate conductive layer being formed using a metal that does not include nitrogen, the upper third gate conductive layer being formed using a metal that includes nitrogen.

In the double-layered structure, the lower first gate conductive layer may be formed using at least one metal selected from a group consisting of tantalum, tungsten, nickel, molybdenum, tantalum silicon, tungsten silicon, titanium silicon, molybdenum silicon and nickel silicon such that the work function of the lower first gate conductive layer becomes about 4.0 eV to about 4.3 eV. The lower third gate conductive layer may be formed using at least one metal selected from a group consisting of titanium, titanium nitride, tungsten, nickel, tungsten silicon, titanium silicon, molybdenum silicon, nickel silicon, ruthenium, ruthenium oxide, iridium, iridium oxide and platinum such that the work function of the lower third gate conductive layer becomes about 4.7 eV to about 5.0 eV. And the upper first and third gate conductive layers may include at least one material selected from a group consisting of tantalum nitride, tungsten nitride, nickel nitride, tantalum silicon nitride, tungsten silicon nitride, titanium silicon nitride, molybdenum silicon nitride, nickel silicon nitride, ruthenium nitride, ruthenium oxynitride, iridium nitride, iridium oxynitride and platinum nitride.

The first gate conductive layer may have a single-layered structure; the first gate conductive layer including the metal having the nitrogen concentration increasing in the direction from the lower portion making contact with the first gate insulating layer toward the upper portion making contact with the second gate conductive layer. And the third gate conductive layer includes the metal having the nitrogen concentration increasing in the direction from the lower portion making contact with the second gate insulating layer toward the upper portion making contact with the fourth gate conductive layer.

In another aspect of the present invention, provided is a method of manufacturing a complementary metal-oxide-semiconductor (CMOS) transistor. In the method, an insulating layer is formed on a semiconductor substrate including a first region and a second region. A first conductive layer is formed on the insulating layer of the first region. The first conductive layer includes a metal having a nitrogen concentration increasing in a direction from a lower portion toward an upper portion. The metal has a work function of about 4.0 eV to about 4.3 eV. A third conductive layer is formed on the insulating layer of the second region. The third conductive layer includes a metal having a nitrogen concentration increasing in a direction from a lower portion toward an upper portion. The metal has a work function of about 4.7 eV to about 5.0 eV. A second conductive layer is formed on the first and third conductive layers. The second conductive layer includes a material having an electrical resistance lower than those of the first conductive layer and third conductive layer. The second conductive layer, the first conductive layer, the third conductive layer, and the insulating layer are then patterned to form first and second gate patterns on the first and second regions. The first gate pattern includes a first gate insulating layer, a first gate conductive layer, and a second gate conductive layer. The second gate pattern includes a second gate insulating layer, a third gate conductive layer, and a fourth conductive layer. A first source/drain pair doped with p-typed impurities is then formed at a surface portion of the first region adjacent to the first gate pattern. A second source/drain pair doped with n-typed impurities is formed at a surface portion of the second region adjacent to the second gate pattern. The n-typed impurities and the p-typed impurities are activated by performing a thermal treatment.

The first conductive layer may be formed using at least one metal selected from a group consisting of tantalum, tungsten, nickel, molybdenum, tantalum silicon, tungsten silicon, titanium silicon, molybdenum silicon and nickel silicon such that the first conductive layer has the work function of about 4.0 eV to about 4.3 eV. And the third conductive layer may be formed using at least one metal selected from a group consisting of titanium, tungsten, nickel, tungsten silicon, titanium silicon, molybdenum silicon, nickel silicon, ruthenium, ruthenium oxide, iridium, iridium oxide and platinum such that the third conductive layer has the work function of about 4.7 eV to about 5.0 eV.

In a double-layered structure approach, to form the first conductive layer, a lower first conductive layer may be formed on the insulating layer of the first region. The lower first conductive layer may include a metal that does not include nitrogen. An upper first conductive layer may then be formed on the lower first conductive layer. The upper first conductive layer may include a metal having nitrogen. And to form the third conductive layer, a lower third conductive layer may be formed on the insulating layer of the second region. The lower third conductive layer may include a metal that does not include nitrogen. An upper third conductive layer may then be formed on the lower third conductive layer. The upper third conductive layer may include a metal having nitrogen.

The lower first conductive layer may be formed using at least one metal selected from a group consisting of tantalum, tungsten, nickel, molybdenum, tantalum silicon, tungsten silicon, titanium silicon, molybdenum silicon and nickel silicon. The lower third conductive layer may be formed using at least one metal selected from a group consisting of titanium, titanium nitride, tungsten, nickel, tungsten silicon, titanium silicon, molybdenum silicon, nickel silicon, ruthenium, ruthenium oxide, iridium, iridium oxide and platinum. And the upper first and third conductive layers may be formed using at least one material selected from a group consisting of tantalum nitride, tungsten nitride, tantalum silicon nitride, tungsten silicon nitride, titanium silicon nitride, molybdenum silicon nitride, nickel silicon nitride, ruthenium nitride, ruthenium oxynitride, iridium nitride, iridium oxynitride and platinum nitride.

In a single-layered structure approach, a preliminary first conductive layer may be formed on the insulating layer of the first region. The preliminary first conductive layer may include a metal that does not include nitrogen. A nitridation treatment may be performed on the preliminary first conductive layer. And to form the third conductive layer, a preliminary third conductive layer may be formed on the insulating layer of the second region. The preliminary third conductive layer may include a metal that does not include nitrogen. A nitridation treatment may be performed on the preliminary third conductive layer.

The amount of nitrogen provided to form the first conductive layer may gradually increase in proportion to a time required to form the first conductive layer when the first conductive layer is formed on the insulating layer of the first region. And the amount of nitrogen provided to form the third conductive layer may gradually increase in proportion to a time required to from the third conductive layer when the third conductive layer is formed on the insulating layer of the second region.

The n-typed impurities may include phosphorus or arsenic and the p-typed impurities may include boron, wherein the method may include implanting the n-typed impurities and the p-typed impurities into the surface of the semiconductor substrate using an ion implantation process.

The thermal treatment may be performed at a temperature of no less than about 1,000° C.

According to aspects of the present invention, when the thermal treatment is performed to the first and third gate conductive layers at a high temperature, the work function of the first and third gate conductive layers may be hardly changed. Accordingly, a metal having the desired work function is efficiently used to form the first and third gate conductive layers of the CMOS transistor. Thus, the CMOS transistor may have a superior electrical performance.

BRIEF DESCRIPTION OF THE DRAWINGS

Aspects of the present invention will become readily apparent by reference to the following detailed description when considered in conjunction with the accompanying drawings, wherein.

DESCRIPTION OF THE EMBODIMENTS

Figure 1:
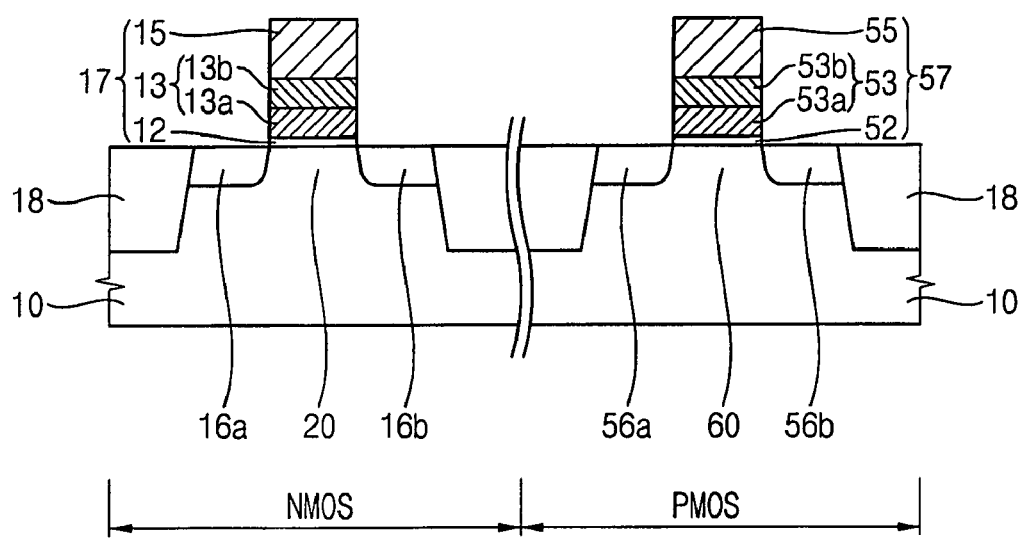
FIG. 1 is a cross-sectional view illustrating an embodiment of a complementary metal-oxide-semiconductor (CMOS) transistor in accordance with an aspect of the present invention.

The present invention is described more fully hereinafter with reference to the accompanying drawings, in which example embodiments in accordance with aspects of the present invention are shown. The present invention may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on" or "connected to" another element or layer, it may be directly on, connected or coupled to the other element or layer or intervening elements or layers may be present. In contrast, when an element is referred to as being "directly on" or "directly connected to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments in accordance with aspects of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments in accordance with aspects of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

FIG. 1 is a cross-sectional view illustrating an embodiments of a complementary metal-oxide-semiconductor (CMOS) transistor in accordance with aspects of the present invention.

Referring to FIG. 1, the CMOS transistor 100 may include an n-typed metal-oxide-semiconductor (NMOS) transistor and a p-typed metal-oxide-semiconductor (PMOS) transistor. The NMOS transistor is formed at a first region of a semiconductor substrate 10. The PMOS transistor is formed at a second region of the semiconductor substrate 10.

The NMOS transistor corresponding to a unit cell may include first source/drains 16a and 16b, a first channel region 20 and a first gate pattern 17. The first gate pattern 17 may include a first gate insulating layer 12, a first gate conductive layer 13, and a second gate conductive layer 15. The PMOS transistor corresponding to a unit cell may include second source/drains 56a and 56b, a second channel region 60 and a second gate pattern 57. The second gate pattern 57 may include a second gate insulating layer 52, a third gate conductive layer 53, and a fourth gate conductive layer 55.

Particularly, the semiconductor substrate 10 may be a silicon substrate, a silicon-on-insulator (SOI) substrate, a germanium substrate, a germanium-on-insulator (GOI) substrate, a silicon-germanium substrate, etc. In an example embodiment, the silicon substrate is used as the semiconductor substrate 10.

A p-typed well may be formed at the first region of the semiconductor substrate 10 on which the NMOS transistor is formed. The p-typed well may be doped with p-typed impurities having a relatively small impurity concentration. In addition, an n-typed well may be formed at the second region of the semiconductor substrate 10 on which the PMOS transistor is formed. The n-typed well may be doped with n-typed impurities having a relatively small impurity concentration.

The first and second gate patterns 17 and 57 are formed on an active region of the semiconductor substrate 10. An isolation layer 18 may be formed at the semiconductor substrate 10 to define the active region. The isolation layer 18 may correspond to a field region enclosing the active region. A trench isolation layer may be used as the isolation layer 18 to achieve a high degree of integration.

In the CMOS transistor 100, the NMOS transistor may use an electron as a charge carrier and the PMOS transistor may use a hole as a charge carrier. In the NMOS transistor, the n-typed impurities generating the electron corresponding to the charge carrier may be implanted to a surface portion of the semiconductor substrate 10 adjacent to the first gate pattern 17 during an ion implantation process. Accordingly, first source/drains 16a and 16b are formed by an ion implantation process. In the PMOS transistor, the p-typed impurities generating the hole corresponding to the charge carrier may be implanted to a surface portion of the semiconductor substrate 10 adjacent to the second gate pattern 57 during an ion implantation process. Accordingly, second source/drains 56a and 56b are also formed by an ion implantation process.

Here, the n-typed impurities in the first source/drains 16a and 16b and the p-typed impurities in the second source/drains 56a and 56b may be implanted by an ion implantation process, a diffusion process, etc. In an example embodiment, the n-typed impurities and the p-typed impurities are implanted by ion implantation processes, as discussed above. The n-typed impurities may be phosphorus (P), arsenic (Ar), etc., as examples. In addition, the p-typed impurities may be boron (B), etc., as examples.

As described above, the first source/drains 16a and 16b are formed at the surface of the first region of the semiconductor substrate 10, so that a first channel region 20 may be formed between the first source/drains 16a and 16b. The second source/drains 56a and 56b are formed at the surface of the second region of the semiconductor substrate 10, and thus a second channel region 60 may be formed between the second source/drains 56a and 56b.

Accordingly, the first gate pattern 17 of the NMOS transistor is formed on the first channel region 20 of the semiconductor substrate 10. The second gate pattern 57 of the PMOS transistor is formed on the second channel region 60 of the semiconductor substrate 10.

A thin equivalent oxide thickness (EOT) of the first gate insulating layer 12 in the first gate pattern 17 needs to be uniformly maintained. The first gate insulating layer 12 is required to sufficiently reduce a leakage current generated between the first gate conductive layer 13 and the first channel region 20. Similarly, a thin equivalent oxide thickness of the second gate insulating layer 52 in the second gate pattern 57 is required to be uniformly maintained. The second gate insulating layer 52 is also required to sufficiently reduce a leakage current generated between the third gate conductive layer 53 and the second channel region 60.

The first and second gate insulating layers 12 and 52 may include metal oxide having a relatively high dielectric constant. Alternatively, the first and second gate insulating layers 12 and 52 may include oxynitride. The metal oxide and the oxynitride may be silicon oxide, silicon oxynitride, hafnium oxide, hafnium oxynitride, hafnium silicon oxynitride, zirconium oxide, zirconium oxynitride, zirconium silicon oxynitride, tantalum oxide, tantalum oxynitride, tantalum silicon oxynitride, aluminum oxide, aluminum oxynitride, aluminum silicon oxynitride, titanium oxide, titanium oxynitride, titanium silicon oxynitride, etc., as examples. These may be used alone or in a combination thereof. For example, the first and second gate insulating layers 12 and 52 may be formed using substantially the same material in accordance with a process for forming such layers.

The first gate conductive layer 13 of the first gate pattern 17 in the NMOS transistor may adjust a work function. The second gate conductive layer 15 may be used as a word line. Similarly, the third gate conductive layer 53 of the second gate pattern 57 in the PMOS transistor may adjust a work function. The fourth gate conductive layer 55 may be used as a word line.

As described above, the first and third gate conductive layers 13 and 53 may adjust the work function. The first gate conductive layer 13 may include a first metal having a work function of about 4.0 eV to about 4.3 eV. The third gate conductive layer 53 may also include a second metal having a work function of about 4.7 eV to about 5.0 eV. Thus, a threshold voltage of each transistor may be efficiently controlled. Particularly, when the first gate conductive layer 13 includes the first metal having the work function of about 4.0 eV to about 4.3 eV, the threshold voltage of NMOS transistor may be efficiently controlled. Similarly, when the third gate conductive layer 53 includes the second metal having the work function of about 4.7 eV to about 5.0 eV, the threshold voltage of PMOS transistor may be efficiently controlled.

The first metal may include tantalum (Ta), tungsten (W), nickel (Ni), molybdenum (Mo), tantalum silicon (TaSi), tungsten silicon (WSi), titanium silicon (TiSi), molybdenum silicon (MoSi), nickel silicon (NiSi), etc., as examples. Here, the metals may be used in a combination such that the first metal may have the work function of about 4.0 eV to about 4.3 eV. In addition, the second metal may include titanium (Ti), titanium nitride (TiN), tungsten (W), nickel (Ni), tungsten silicon (WSi), titanium silicon (TiSi), molybdenum silicon (MoSi), nickel silicon (NiSi), ruthenium (Ru), ruthenium oxide (RuO), iridium (Ir), iridium oxide (IrO), platinum (Pt), etc., as examples. Here, the metals may be used in a combination such that the second metal may have the work function of about 4.7 eV to about 5.0 eV.

An example of a first metal that may be used to form the first gate conductive layer 13 is tantalum silicon. An example of a second metal that may be used to form the second gate conductive layer 15 is titanium nitride.

In an example embodiment, the first gate conductive layer 13 may include a metal having a nitrogen concentration increasing in a direction from a lower portion making contact with the first gate insulating layer 12 toward an upper portion making contact with the second gate conductive layer 15. In addition, the third gate conductive layer 53 includes a metal having a nitrogen concentration increasing in a direction from a lower portion making contact with the second gate insulating layer 52 toward an upper portion making contact with the fourth gate conductive layer 55. Accordingly, a distribution of the nitrogen included in the first gate conductive layer 13 and the third gate conductive layer 53 may be effectively controlled. As a result, when a thermal treatment for activating the impurities is performed after implanting the impurities into the surface of the semiconductor substrate 10 to form the first source/drains 16a and 16b, a chemical reaction between the first gate conductive layer 13 and the second gate conductive layer 15 may be prevented. Similarly, when a thermal treatment for activating the impurities is performed after implanting the impurities into the surface of the semiconductor substrate 10 to form the second source/drains 56a and 56b, a chemical reaction between the third gate conductive layer 53 and the fourth gate conductive layer 55 may be prevented. That is, the nitrogen concentrations of the first and third gate conductive layers 13 and 53 may increase in the direction from the lower portions toward the upper portions thereof so that the nitrogen may prevent the first and third gate conductive layers 13 and 53 from being reacted with the second and fourth gate conductive layers 15 and 55, respectively, in the thermal treatments.

As described above, the first and third gate conductive layers 13 and 53 include the metal having the nitrogen concentrations increasing in the direction from the lower portions toward the upper portions thereof so that the metal may sufficiently prevent changes of the work functions when the thermal treatments for activating the impurities are performed.

In addition, the nitrogen may be hardly distributed or not be distributed at all at the lower portion of the first gate conductive layer 13 making contact with the first gate insulating layer 12 and at the lower portion of the third gate conductive layer 53 making contact with the second gate insulating layer 52. Thus, electrical characteristics of the first and third gate conductive layers 13 and 53 may be sufficiently maintained.

The first and third gate conductive layers 13 and 53 may have a single-layered structure or a double-layered structure. In an example embodiment, the first and third gate conductive layers 13 and 53 have a double-layered structure, as illustrated in FIG. 1.

Here, when the first gate conductive layer 13 has the double-layered structure, the first gate conductive layer 13 may include a lower first gate conductive layer 13a and an upper first gate conductive layer 13b. The lower first gate conductive layer 13a is formed on the first gate insulating layer 12. The upper first gate conductive layer 13b is formed on the lower first gate conductive layer 13a. In addition, when the third gate conductive layers 53 has the double-layered structure, the third gate conductive layer 53 may include a lower third gate conductive layer 53a and an upper third gate conductive layer 53b. The lower third gate conductive layer 53a is formed on the second gate insulating layer 52. The upper third gate conductive layer 53b is formed on the lower third gate conductive layer 53a. The lower first gate conductive layer 13a and the lower third gate conductive layer 53a may include a metal that does not have nitrogen. The upper first gate conductive layer 13b and the upper third gate conductive layer 53b may include a metal that has nitrogen.

The lower first gate conductive layer 13a is included in the NMOS transistor. The lower first gate conductive layer 13a may include tantalum (Ta), tungsten (W), nickel (Ni), molybdenum (Mo), tantalum silicon (TaSi), tungsten silicon (WSi), titanium silicon (TiSi), molybdenum silicon (MoSi), nickel silicon (NiSi), etc., as examples Here, the above materials may be used alone or in a combination, such that the lower first gate conductive layer 13a may have the work function of about 4.0 eV to about 4.3 eV. In addition, the lower third gate conductive layer 53a is included in the PMOS transistor. Thus, the lower third gate conductive layer 53a may include titanium (Ti), titanium nitride (TiN), tungsten (W), nickel (Ni), tungsten silicon (WSi), titanium silicon (TiSi), molybdenum silicon (MoSi), nickel silicon (NiSi), ruthenium (Ru), ruthenium oxide (RuO), iridium (Ir), iridium oxide (IrO), platinum (Pt), etc., as examples. Here, the above materials may be used alone or in a combination such that the lower third gate conductive layer 53a has the work function of about 4.7 eV to about 5.0 eV. Further, the upper first gate conductive layer 13b and the upper third gate conductive layer 53b may include tantalum nitride (TaN), tungsten nitride (WN), tantalum silicon nitride (TaSiN), tungsten silicon nitride (WSiN), titanium silicon nitride (TiSiN), molybdenum silicon nitride (MoSiN), nickel silicon nitride (NiSiN), ruthenium nitride (RuN), ruthenium oxynitride (RuON), iridium nitride (IrN), iridium oxynitride (IrON), platinum nitride (PtN), etc., as examples. These may be used alone or in a combination thereof.

Additionally, the lower first gate conductive layer 13a of the NMOS transistor and the lower third gate conductive layer 53a of the PMOS transistor may include different materials. However, the upper first gate conductive layer 13b and the upper third gate conductive layer 53b may include different materials or substantially the same material. This is because the lower first gate conductive layer 13a and the lower third gate conductive layer 53a may be directly used to control work functions.

In addition, when the first gate conductive layer 13 has the single-layered structure, the first gate conductive layer 13 may include the metal having a nitrogen concentration increasing in a direction from a lower portion making contact with the first gate insulating layer 12 toward an upper portion making contact with the second gate conductive layer 15. In addition, the third gate conductive layer 53 may include the metal having a nitrogen concentration increasing in a direction from a lower portion making contact with the second gate insulating layer 52 toward an upper portion making contact with the fourth gate conductive layer 55. Here, when the first and third gate conductive layers 13 and 53 are formed on the first and second gate insulating layers 12 and 52, respectively, the distribution of the nitrogen included in the first and third gate conductive layers 13 and 53 may be adjusted by controlling a process condition. In addition, the distribution of the nitrogen may be adjusted by a nitridation process performed after the first and third gate conductive layers 13 and 53 are formed on the first and second gate insulating layers 12 and 52, respectively.

As described above, the first gate conductive layer 13 and the third gate conductive layer 53 may have the double-layered structure or the single-layered structure. As one alternative, the first gate conductive layer 13 and the third gate conductive layer 53 may have the double-layered structure and the single-layered structure, respectively. As another alternative, the first gate conductive layer 13 and the third gate conductive layer 53 may have the single-layered structure and the double-layered structure, respectively.

The second and fourth gate conductive layers 15 and 55 are used as the word line so that the second and fourth gate conductive layers 15 and 55 may include a material having a resistance lower than those of the first and third gate conductive layers 13 and 53. The second and fourth gate conductive layers 15 and 55 may include a metal having a low resistance, such as tungsten, aluminum, etc., as examples. Alternatively, the second and fourth gate conductive layers 15 and 55 may include polysilicon instead of the metal.

According to the present invention, the first and third gate conductive layers 13 and 53 may include a metal having a nitrogen concentration increasing from lower portions toward upper portions thereof. Thus, changes in the work functions may be sufficiently prevented during a subsequent process. Accordingly, the NMOS and PMOS transistors including the first and second gate patterns 17 and 57 may uniformly maintain the work function. Therefore, the CMOS transistor 100 including the NMOS and PMOS transistors may be effectively obtained.

Hereinafter, an embodiment of a method of manufacturing the above CMOS transistor is described.

FIGS. 2A to 2I are cross-sectional views illustrating a method of manufacturing the complementary metal-oxide-semiconductor (CMOS) transistor in FIG. 1. Here, the same reference numerals will be used to refer to the same or like parts as those illustrated in FIG. 1.

Firstly, a well (not shown) doped with impurities having a low impurity concentration is formed in a semiconductor substrate. Here, to form the CMOS transistor, a p-typed well may be formed in an n-typed metal-oxide-semiconductor (NMOS) region of the semiconductor substrate on which the NMOS transistor is formed. An n-typed well may be formed in a p-typed metal-oxide-semiconductor (PMOS) region of the semiconductor substrate on which the PMOS transistor is formed. Here, the p-typed well may be doped with p-typed impurities having a low impurity concentration. The n-typed well may be doped with n-typed impurities having a low impurity concentration.

Referring to 2A, an isolation layer 18 is formed in a surface of the semiconductor substrate 10. Accordingly, the semiconductor substrate 10 is divided by the isolation layer 18 into an active region and a field region. Here, a trench isolation layer may be used as the isolation layer 18 to increase an integration degree.

Referring to 2B, an insulating layer 32 is formed on the semiconductor substrate 10. The insulating layer 32 is to be transformed into a first gate insulating layer of the NMOS transistor and a second gate insulating layer of the PMOS transistor. The insulating layer 32 may be formed using metal oxide, metal oxynitride, etc., as examples. The insulating layer 32 may be formed to have an equivalent oxide thickness (EOT) of no more than about 20 Å, in this embodiment. The insulating layer 32 may be formed by an atom layer deposition (ALD) process, a chemical vapor deposition (CVD) process, etc., as examples.

The first gate insulating layer of the NMOS transistor and the second gate insulating layer of the PMOS transistor are obtained from the insulating layer 32. Thus, processes for forming the first and second insulating layers may be simplified.

A stabilizing treatment may be performed to stabilize the insulating layer 32 after the insulating layer 32 is formed on the substrate 10. Thus, defects to the insulating layer 32 may be cured by the stabilizing treatment. In addition, the stabilizing treatment may be performed at an oxygen atmosphere or at a nitrogen atmosphere. Alternatively, the stabilizing treatment may be performed by a plasma treatment, an ozone treatment, etc., as other examples.

A first gate conductive layer of the NMOS transistor and a third gate conductive layer of the PMOS transistor may have a double-layered structure or a single-layered structure. In an example embodiment, the first and third gate conductive layers have a double-layered structure.

Figure 2A:
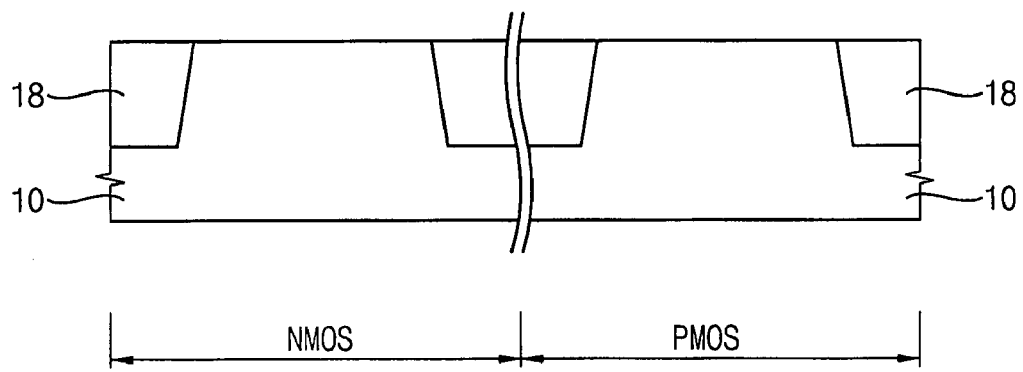
FIGS. 2A to 2I are cross-sectional views illustrating an embodiment of a method of manufacturing the CMOS transistor in FIG. 1.
Figure 2B:
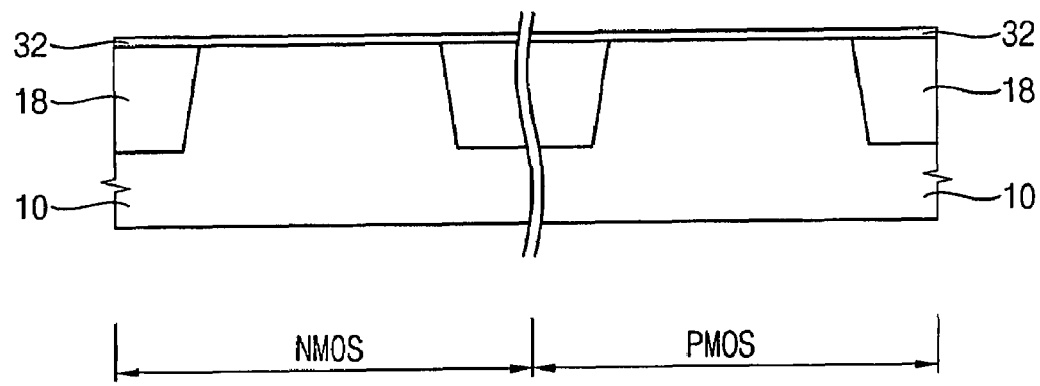
Figure 2C:
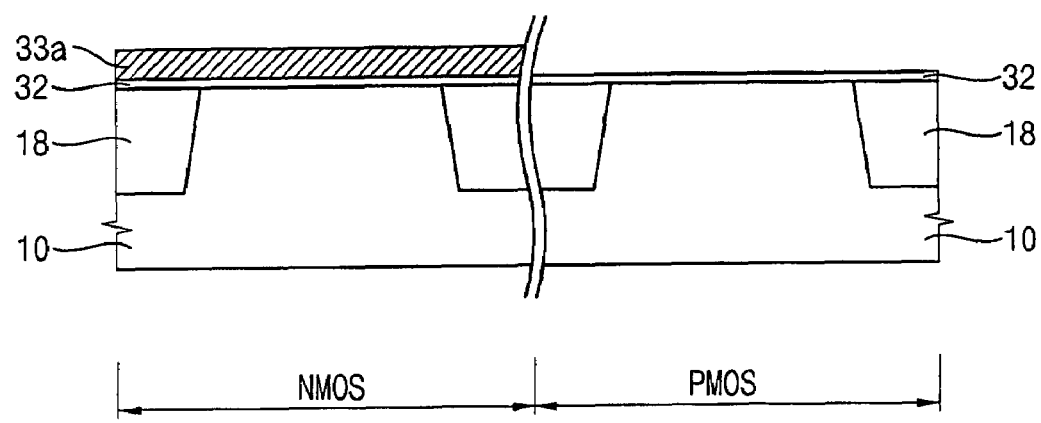

Referring to FIG. 2C, a lower first conductive layer 33a is formed only on the insulating layer 32 of the NMOS region. Here, the lower first conductive layer 33a may be employed to form the lower first gate conductive layer illustrated in FIG. 1. Thus, the lower first conductive layer 33a may be formed using a metal that does not include nitrogen. For example, the lower first conductive layer 33a is employed in the NMOS transistor. Thus, the lower first conductive layer 33a may include a metal having a work function of about 4.0 eV to about 4.3 eV. In an example embodiment, the lower first conductive layer 33a may include tantalum silicon. To form the lower first conductive layer 33a, a deposition process such as a CVD process may be performed. A photolithography process may be then performed to form the first conductive layer 33a. The lower first conductive layer 33a may be formed only on the insulating layer 32 of the NMOS region by the photolithography process employing a photoresist pattern. Here, an etching process employing a hard mask pattern as an etch mask may be employed instead of the photolithography process. The hard mask pattern may be formed using silicon nitride, polysilicon, etc., as examples.

Figure 2D:
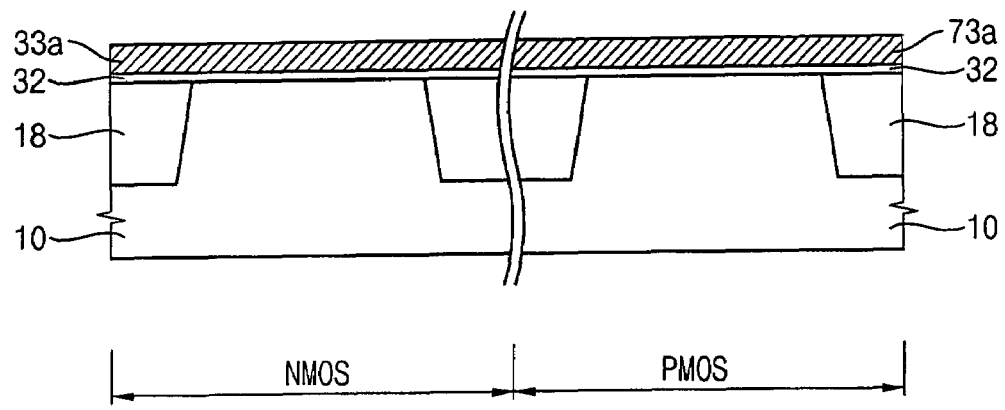

Referring to FIG. 2D, a lower third conductive layer 73a is formed only on the insulating layer 32 of the PMOS region. Here, the lower third conductive layer 73a may be employed to form a lower third gate conductive layer. Thus, the lower third conductive layer 73a may include a metal that does not include nitrogen. For example, the lower third conductive layer 73a is employed in the PMOS transistor. Thus, the lower third conductive layer 73a may include the metal having a work function of about 4.7 eV to about 5.0 eV. In an example embodiment, the lower third conductive layer 73a may include titanium. To form the lower third conductive layer 73a, a deposition process such as a CVD process is performed. A photolithography process may be then performed to form the lower third conductive layer 73a. The lower third conductive layer 73a may be formed only on the insulating layer 32 of the PMOS region by the photolithography process using a photoresist pattern. Alternatively, an etching process employing a hard mask pattern as an etch mask may be performed instead of the photolithography process. The hard mask pattern may include silicon nitride, polysilicon, etc., as examples.

Figure 2E:
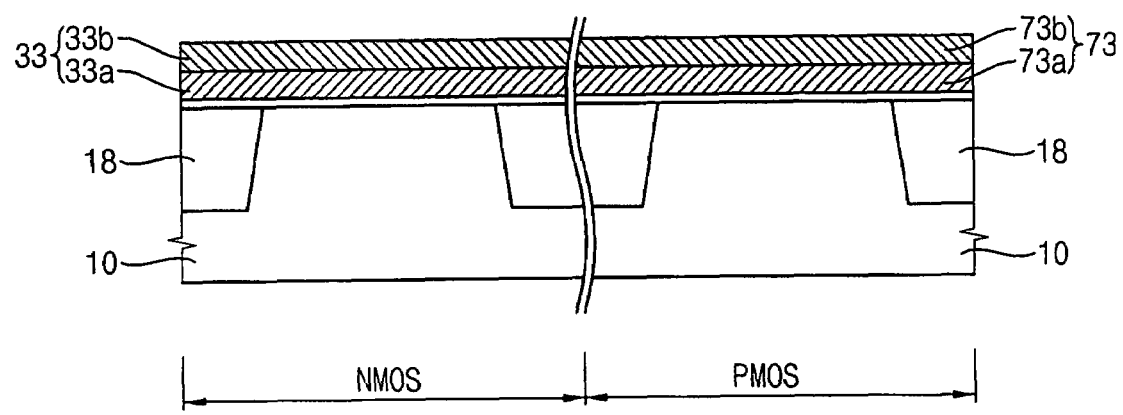

Referring to FIG. 2E, an upper first conductive layer 33b and an upper third conductive layer 73b are formed on the lower first conductive layer 33a and the lower third conductive layer 73a, respectively. Here, the upper first conductive layer 33b may be used to form an upper first gate conductive layer. The upper third conductive layer 73b may be used to form an upper third gate conductive layer. For example, the upper first conductive layer 33b and the upper third conductive layer 73b are formed using different metals that include nitrogen. Preferably, the upper first conductive layer 33b and the upper third conductive layer 73b may be formed using substantially the same metal that includes nitrogen with consideration of a process order. For example, the upper first conductive layer 33b and the upper third conductive layer 73b may be simultaneously formed on the lower first conductive layer 33a and the lower third conductive layer 73a by the same process using the same metal including nitrogen. The upper first conductive layers 33b and 73b are explained using different reference numerals for convenience of explanation. However, in the present embodiment, the upper first conductive layer 33b and the upper third conductive layer 73b are formed in the same process so that the upper first conductive layer 33b and the upper third conductive layer 73b may be formed as one body. The upper first conductive layer 33b and the upper third conductive layer 73b may be formed by a CVD process. The upper first conductive layer 33b and the upper third conductive layer 73b may include tantalum nitride (TaN), tungsten nitride (WN), nickel nitride (NiN), tantalum silicon nitride (TaSiN), tungsten silicon nitride (WSiN), titanium silicon nitride (TiSiN), molybdenum silicon nitride (MoSiN), nickel silicon nitride (NiSiN), ruthenium nitride (RuN), ruthenium oxynitride (RuON), iridium nitride (IrN), iridium oxynitride (IrON), platinum nitride (PtN), etc. These may be used alone or in a combination thereof. In an example embodiment, the upper first conductive layer 33b and the upper third conductive layer 73b include tantalum silicon nitride.

Accordingly, a first conductive layer 33 including the lower first conductive layer 33a and the upper first conductive layer 33b is formed on the NMOS region of the semiconductor substrate 10. A third conductive layer 73 including the lower third conductive layer 73a and the upper third conductive layer 73b is formed on the PMOS region of the semiconductor substrate 10.

In an example embodiment, the first conductive layer 33 and the third conductive layer 73 have a double-layered structure. In another example embodiment, the first conductive layer 33 and the third conductive layer 73 may have a single-layered structure. For example, the first conductive layer 33 and the third conductive layer 73 may be formed in-situ. Alternatively, the first conductive layer 33 and the third conductive layer 73 may be formed ex-situ.

In case that the first conductive layer 33 and the third conductive layer 73 are formed ex-situ, a preliminary first conductive layer may be formed on the insulating layer of the NMOS region. A preliminary third conductive layer may be formed on the insulating layer of the PMOS region. Here, the preliminary first conductive layer and the preliminary third conductive layer may include a metal that does not include nitrogen. The first and third conductive layers are then formed by a nitridation process. Here, the nitridation process may be a plasma nitridation process.

Alternatively, in case that the first conductive layer 33 and the third conductive layer 73 are formed in-situ, the amount of nitrogen provided to form the first conductive layer may gradually increase in proportional to a time required to form the first conductive layer on the insulating layer of the NMOS region. Thus, a nitrogen concentration of the first conductive layer may increase in a direction from a lower portion toward an upper portion thereof. In addition, the amount of nitrogen provided to form the third conductive layer may gradually increase in proportional to a time required to form the third conductive layer on the insulating layer of the PMOS region. Thus, a nitrogen concentration of the third conductive layer may increase in a direction from a lower portion toward an upper portion. That is, when the first and third conductive layers are formed on the insulating layer, the amount of nitrogen provided to form the first and third conductive layers may be gradually increased.

Figure 2F:
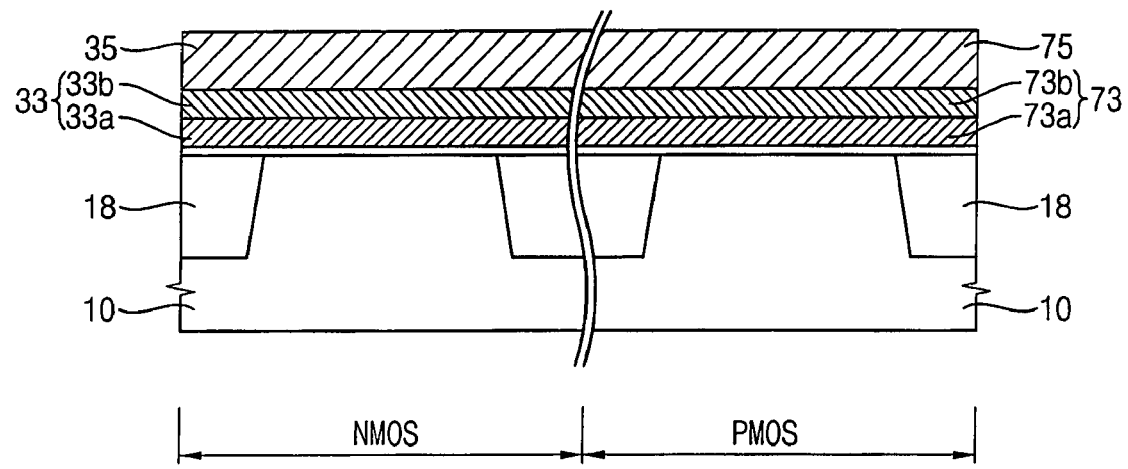

As described above, the first and third conductive layers 33 and 73 are formed on the insulating layer 32. As illustrated in FIG. 2F, a second conductive layer 35 and a fourth conductive layer 75 are then formed on the first and third conductive layers 33 and 73, respectively. Here, the second conductive layer 35 is used to form a second gate conductive layer of the NMOS transistor. In addition, the fourth conductive layer 75 is used to form a fourth gate conductive layer of the PMOS transistor. Thus, the second and fourth conductive layers 35 and 75 may include a material having a lower resistance than those of the first and third conductive layers 33 and 73. In addition, the second and fourth conductive layers 35 and 75 may be formed by a CVD process.

The second and fourth conductive layers 35 and 75 may be preferably formed using substantially the same metal that includes nitrogen, with consideration of a process order. For example, the second and fourth conductive layers 35 and 75 may be simultaneously formed on the first and third conductive layers 33 and 73 by the same process using the same material having a resistance lower than those of the first and third conductive layers 33 and 73. In addition, the second conductive layer 35 and the fourth conductive layer 75 are described using different reference numerals for convenience of explanation. However, the second conductive layer 35 and the fourth conductive layer 75 are formed as one body by the same process, so that the second conductive layer 35 may be substantially the same as the fourth conductive layer 75. In an example embodiment, the second and fourth conductive layers 35 and 75 may include tungsten.

Figure 2G:
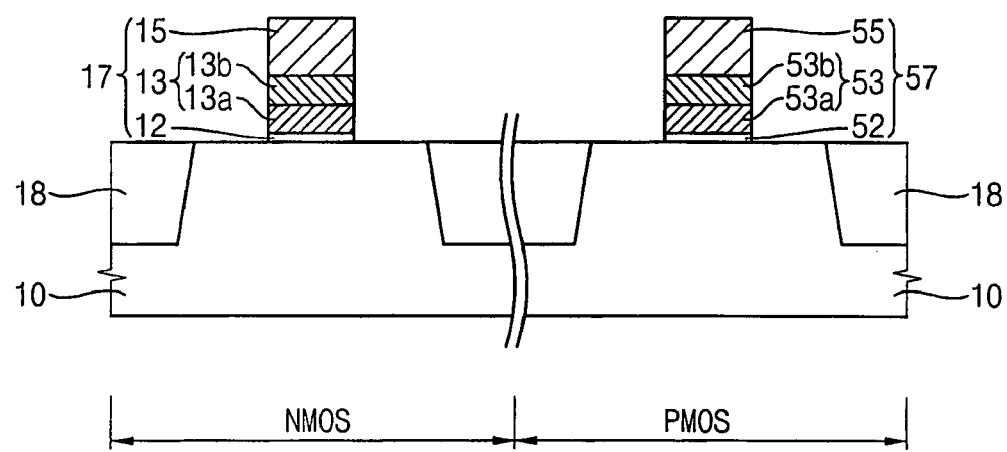

Referring to FIG. 2G, the second conductive layer 35, the first conductive layer 33 and the insulating layer 32 formed in the NMOS region, and the fourth conductive layer 75, the third conductive layer 73 and the insulating layer 32 formed in the PMOS region are subsequently patterned by a photolithography process using a photoresist pattern as an etch mask. Accordingly, a first gate pattern 17, including a first gate insulating layer 12, a first gate conductive layer 13, and a second gate conductive layer 15, is formed on the semiconductor substrate 10 of the NMOS region. In addition, a second gate pattern 57, including a second gate insulating layer 52, a third gate conductive layer 53, and a fourth gate conductive layer 55, is formed on the semiconductor substrate 10 of the PMOS region.

In addition, the first and third conductive layers 33 and 73 may have the double-layered structure. Thus, the first gate conductive layer 13 may include the lower first gate conductive layer 13a and the upper first gate conductive layer 13b. Similarly, the third gate conductive layer 53 may include the lower third gate conductive layer 53a and the upper third gate conductive layer 53b.

Figure 2H:
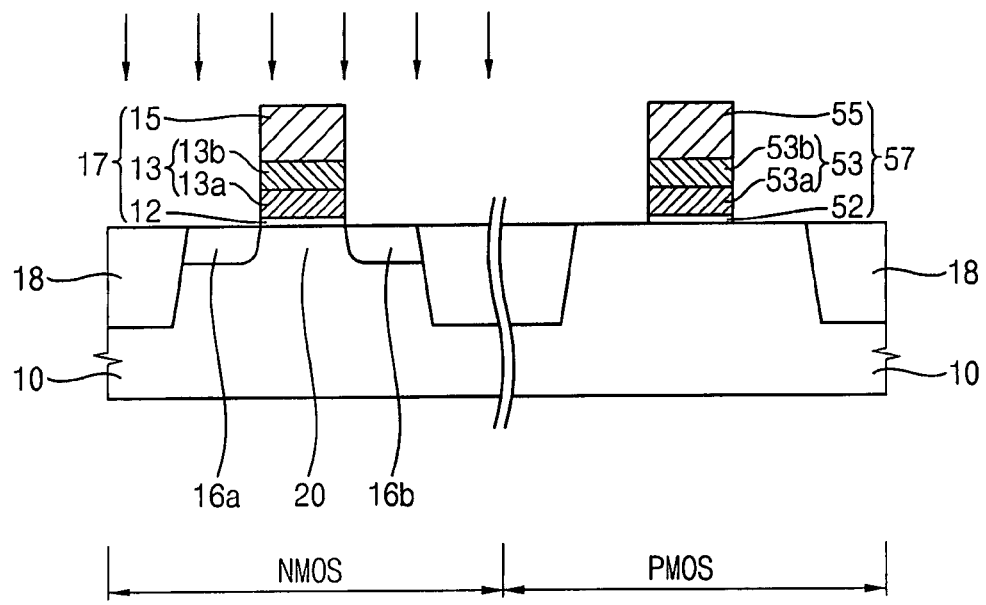

Referring to FIG. 2H, an ion implantation process is performed using the first gate pattern 17 as an ion implantation mask. Accordingly, first source/drains 16a and 16b doped with impurities by the ion implantation process are formed at surface portions of the semiconductor substrate 10 adjacent to the first gate pattern 17. Here, the first source/drains 16a and 16b are formed at the NMOS region. Thus, the impurities used for the first source/drains 16a and 16b may be phosphorus, arsenic, etc., as examples. A photoresist pattern is formed to cover the PMOS region so that the impurities may be hardly implanted into the semiconductor substrate 10 of the PMOS region by the ion implantation process.

Figure 2I:
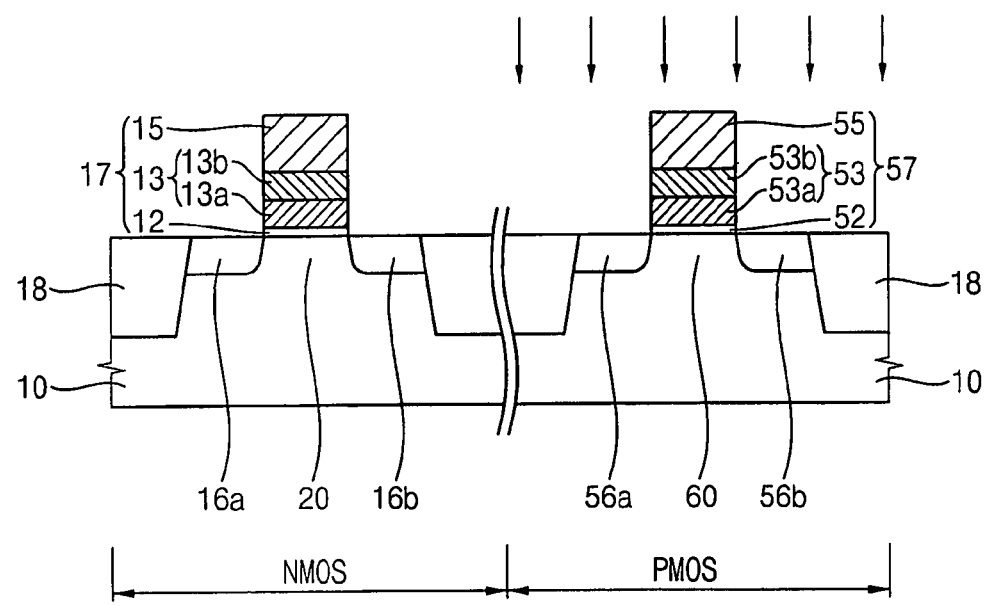

Referring to FIG. 2I, an ion implantation process is performed using the second gate pattern 57 as an ion implantation mask. Accordingly, second source/drains 56a and 56b doped with impurities by the ion implantation process are formed at surface portions of the semiconductor substrate 10 adjacent to the second gate pattern 57. Here, the second source/drains 56a and 56b are formed at the PMOS region. Thus, the impurities used for the second source/drains 56a and 56b may be boron, etc., as examples. A photoresist pattern is formed at the NMOS region so that the impurities may be hardly implanted into the semiconductor substrate 10 of the NMOS region by the ion implantation process.

In another example embodiment, gate spacers may be formed on sidewalls of the first gate pattern and the second gate pattern after the first source/drains and the second source/drains are formed at the semiconductor substrate. The gate spacers may include silicon nitride. The gate spacers may be formed by subsequently performing a deposition process and an anisotropic etching process. An ion implantation process is then performed using the first gate pattern and the gate spacers formed on the sidewalls of the first gate pattern as an ion mask. In addition, an ion implantation process is performed using the second gate pattern and the gate spacer formed on the sidewalls of the second gate pattern as an ion mask. Thus, the first source/drains and the second source/drains having a lightly-doped-drain (LDD) structure are formed by the ion implantation process. The first and second source/drains having the LDD structure include a shallow junction region and a deep junction region.

As described above, a thermal treatment is performed at a high temperature after the first gate pattern 17, the second gate pattern 57, the first source/drains 16a and 16b, and the second source/drains 56a and 56b are formed. The thermal treatment is performed to activate the impurities of the first source/drains 16a and 16b and the second source/drains 56a and 56b. Here, the high temperature thermal treatment is performed at a temperature of no less than about 1,000° C.

Accordingly, the CMOS transistor including the NMOS transistor and the CMOS transistor may be formed by performing the above processes. Here, the NMOS transistor includes the first gate pattern 17 and the first source/drains 16a and 16b. The CMOS transistor includes the second gate 57 and the second source/drains 56a and 56b.

The first gate conductive layer 13 includes a metal having a nitrogen concentration increasing in a direction from a lower portion making contact with the first gate insulating layer 12 toward an upper portion making contact with the second conductive layer 15. Similarly, the third gate conductive layer 53 includes a metal having a nitrogen concentration increasing in a direction from a lower portion making contact with the second gate insulating layer 52 toward an upper portion making contact with the fourth conductive layer 55. Therefore, when the thermal treatment for activating the impurities is performed, the work function of the first and third gate conductive layers 13 and 53 is not be changed.

In the CMOS transistor including the NMOS transistor and the CMOS transistor, the first and third gate conductive layers including the metal sufficiently maintaining the work function may be efficiently formed.

Figure 3:
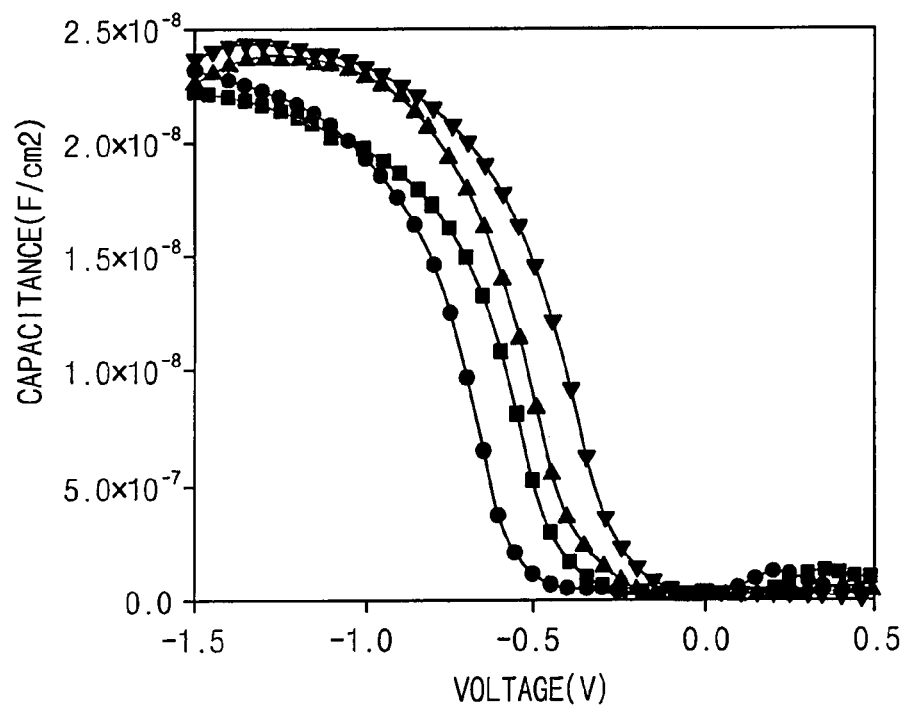
FIG. 3 is a graph illustrating a characteristic of a capacitance-voltage (C-V) curve of the CMOS transistor of FIG. 1.

FIG. 3 is a graph illustrating a characteristic of a capacitance-voltage (C-V) curve of a complementary metal-oxide-semiconductor (CMOS) transistor.

Referring to FIG. 3, a curve -■- and a curve -●- represent the C-V characteristic of the NMOS transistor. Particularly, the curve -■- represents the C-V characteristic of the NMOS transistor including a gate conductive layer formed using tantalum silicon. In addition, the curve -●- represents the C-V characteristic of the NMOS transistor including a gate conductive layer formed using tantalum silicon and tantalum silicon nitride. Here, the NMOS transistor was obtained by performing a thermal treatment at a temperature of about 1,000° C.

A curve -▲- and a curve -▼- represent the C-V characteristic of the PMOS transistor. Particularly, the curve -▲- represents the C-V characteristic of the PMOS transistor including a gate conductive layer formed using titanium nitride. In addition, the curve -▼- represents the C-V characteristic of the PMOS transistor including a gate conductive layer formed by using titanium nitride and tantalum silicon nitride. Here, the PMOS transistor was obtained by performing a thermal treatment at a temperature of about 1,000° C.

According to an estimated result of the C-V characteristic, the curve -●- may represent the C-V characteristic superior to the curve -■- in the NMOS transistor. In addition, the curve -▼- may represent the C-V characteristic superior to the curve -▲- in the NMOS transistor.

Accordingly, when the CMOS transistor includes the NMOS transistor and the PMOS transistor having the gate conductive layer formed by the above method in accordance with aspects of the present invention, a superior electrical characteristic is maintained during the thermal treatment. This is because the work function of the metal used for the gate conductive layer of the NMOS transistor and the PMOS transistor is hardly changed during the thermal treatment.

Figure 4:
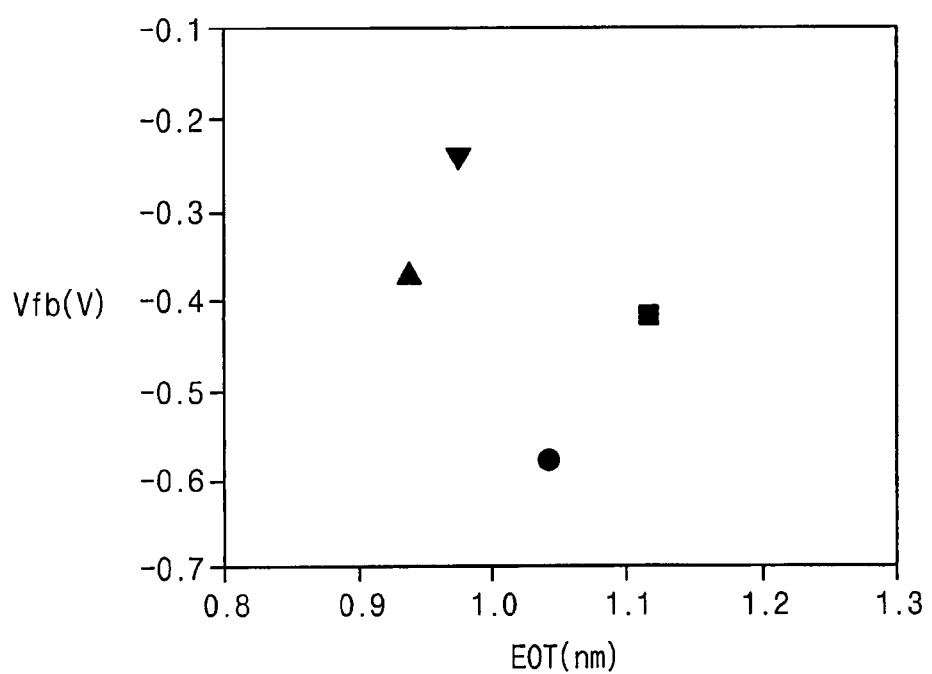
FIG. 4 is a graph illustrating a voltage characteristic of a flat band of the CMOS transistor of FIG. 1.

FIG. 4 is a graph illustrating a voltage characteristic of a flat band of a complementary metal-oxide-semiconductor (CMOS) transistor.

Referring to 4, a symbol ■ and a symbol ● represent a flat band voltage characteristic of the NMOS transistor corresponding to the curve -■- and the curve -●- in FIG. 3, respectively. In addition, a symbol ▲ and a symbol ▼ represent a flat band voltage characteristic of the PMOS transistor corresponding to the curve -▲- and the curve -▼- in FIG. 3, respectively.

According to an estimated result of the flat band voltage characteristic, a flat band voltage Vfb of about −0.55 V represented by the symbol ● may correspond to a work function of about 4.3 eV. Alternatively, a flat band voltage Vfb of about −0.35 V represented by the symbol ■ may correspond to a work function of about 4.5 eV.

In addition, a flat band voltage Vfb of about −0.25 V represented by the symbol ▼ may correspond to a work function of about 4.65 eV. Alternatively, a flat band voltage Vfb of about −0.35 V represented by the symbol ▲ may correspond to a work function of about 4.5 eV.

Accordingly, when the CMOS transistor includes the NMOS transistor and the PMOS transistor having the gate conductive layer formed by the above method in accordance with aspects of the present invention, the flat band voltage characteristic is maintained during the thermal treatment.

This is because the work function of the metal used for the gate conductive layer of the NMOS transistor and the PMOS transistor is hardly changed during the thermal treatment.

Figure 5:
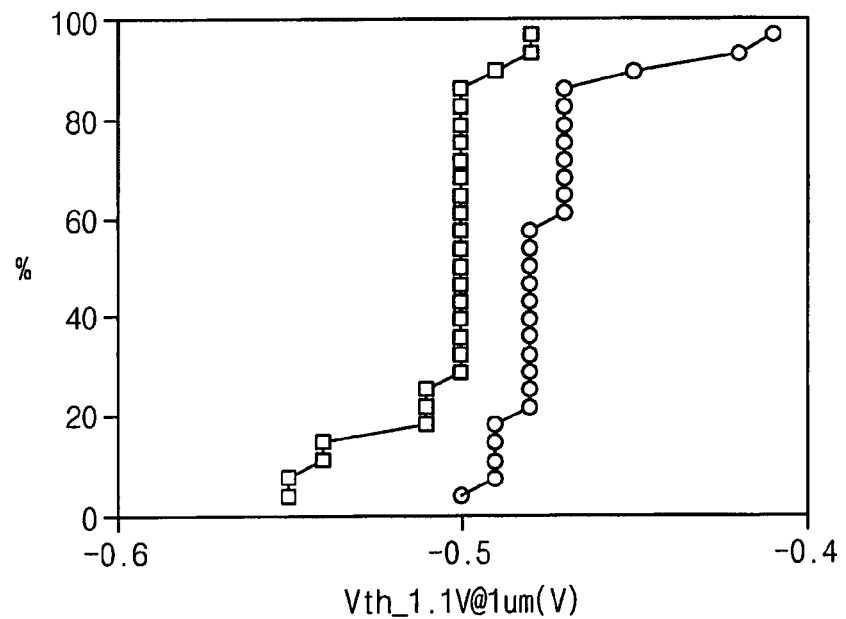
FIG. 5 is a graph illustrating a threshold voltage characteristic of a p-typed metal-oxide-semiconductor (PMOS) transistor in the CMOS transistor of FIG. 1.
Figure 6:
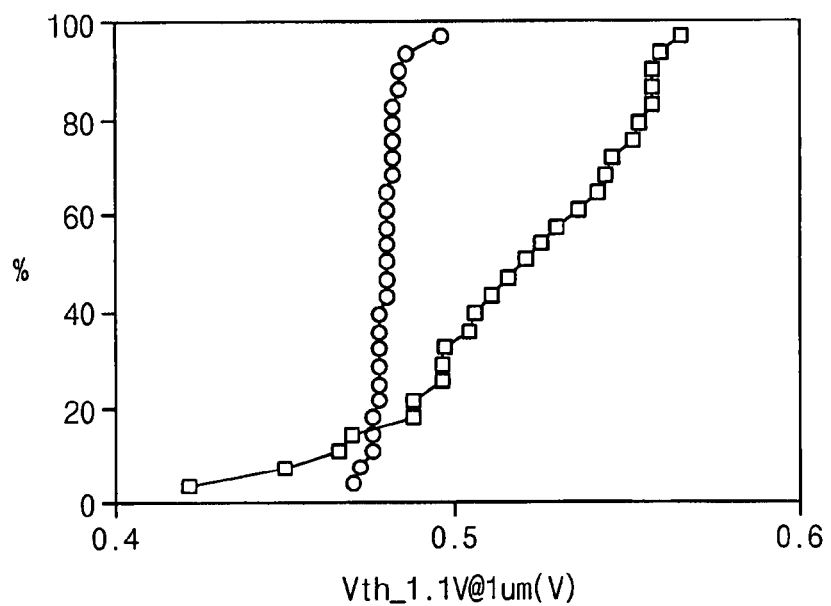
FIG. 6 is a graph illustrating a threshold voltage characteristic of an n-typed metal-oxide-semiconductor (NMOS) transistor in the CMOS transistor of FIG. 1.

FIG. 5 is a graph illustrating a threshold voltage characteristic of a p-typed metal-oxide-semiconductor (PMOS) transistor in the complementary metal-oxide-semiconductor (CMOS) transistor. FIG. 6 is a graph illustrating a threshold voltage characteristic of an n-typed metal-oxide-semiconductor (NMOS) transistor in the CMOS transistor.

Referring to FIG. 5, a curve -○- represents a threshold voltage characteristic of the PMOS transistor corresponding to the curve -▼- in FIG. 3. In addition, a curve -□- represents a threshold voltage characteristic of the PMOS transistor corresponding to the curve -▲- in FIG. 3.

According to an estimated result of the threshold voltage characteristic of the PMOS transistor, the PMOS transistor including the gate conductive layer formed using titanium nitride and tantalum silicon nitride has a greater threshold voltage characteristic.

Referring to 6, a curve -○- represents a threshold voltage characteristic of the NMOS transistor corresponding to the curve -●- in FIG. 3. In addition, a curve -□- represents a threshold voltage characteristic of the NMOS transistor corresponding to the curve -■- in FIG. 3.

According to an estimated result of the threshold voltage characteristic of the NMOS transistor, the NMOS transistor including the gate conductive layer formed using tantalum silicon and tantalum silicon nitride has a superior threshold voltage characteristic. In addition, when the NMOS transistor includes the gate conductive layer formed using tantalum silicon and tantalum silicon nitride, a distribution of the threshold voltage characteristic may be improved.

The threshold voltage characteristic of the CMOS transistor including the NMOS transistor and the PMOS transistor having the gate conductive layer formed by the above method in accordance with aspects of the present invention may be satisfactorily maintained during the thermal treatment. This is because the work function of the metal used for the gate conductive layer of the NMOS transistor and the PMOS transistor is hardly changed during the thermal treatment.

According to aspects of the present invention, when the thermal treatment is performed at the high temperature to activate the impurities of the source/drain, the work function of the gate conductive layer is hardly changed. Thus, the metal may be easily used to form the gate conductive layer of the CMOS transistor.

The foregoing is illustrative of the present invention and is not to be construed as limiting thereof. Although a few embodiments of this invention have been described, those skilled in the art will readily appreciate that many modifications are possible in the embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A complementary metal-oxide-semiconductor transistor, comprising:
 a semiconductor substrate including a first region and a second region;
 an n-typed metal-oxide-semiconductor transistor formed at the first region of the semiconductor substrate, the n-typed metal-oxide-semiconductor transistor including a first source/drain pair, a first channel region and a first gate pattern, the first source/drain pair being formed at a surface of the semiconductor substrate and doped with n-typed impurities, the first channel region being formed at a surface portion of the semiconductor substrate located between a source and a drain of the first source/drain pair, the first gate pattern being formed on the first channel region and including a first gate insulating layer, a first gate conductive layer and a second gate conductive layer, the first gate conductive layer including a metal having a nitrogen concentration increasing in a direction from a lower portion toward an upper portion, the metal having a work function of about 4.0 eV to about 4.3 eV, and the second gate conductive layer including a material having an electrical resistance lower than that of the first gate conductive layer; and
 a p-typed metal-oxide-semiconductor transistor formed at the second region of the semiconductor substrate, the p-typed metal-oxide-semiconductor transistor including a second source/drain pair, a second channel region and a second gate pattern, the second source/drain pair being formed at a surface of the semiconductor substrate and doped with n-typed impurities, the second channel region being formed at a surface portion of the semiconductor substrate located between a source and a drain of the second source/drain pair, the second gate pattern being formed on the second channel region and including a second gate insulating layer, a third gate conductive layer and a fourth gate conductive layer, the third gate conductive layer including a metal having a nitrogen concentration increasing in a direction from a lower portion toward an upper portion, the metal having a work function of about 4.7 eV to about 5.0 eV, and the fourth gate conductive layer including a material having an electrical resistance lower than that of the third gate conductive layer, wherein:
 the first gate conductive layer has a double-layered structure including a lower first gate conductive layer formed on the first gate insulating layer and an upper first gate conductive layer formed on the lower first gate conductive layer, the lower first gate conductive layer being formed using a metal that does not include nitrogen, the upper first gate conductive layer being formed using a metal that includes nitrogen, and
 the third gate conductive layer has a double-layered structure including a lower third gate conductive layer formed on the second gate insulating layer and an upper third gate conductive layer formed on the lower second gate conductive layer, the lower third gate conductive layer being formed using a metal that does not include nitrogen, the upper third gate conductive layer being formed using a metal that includes nitrogen.

2. The complementary metal-oxide-semiconductor transistor of claim 1, wherein the first source/drain pair comprises phosphorus or arsenic and the second source/drain pair comprises boron.

3. The complementary metal-oxide-semiconductor transistor of claim 1, wherein the first gate conductive layer is formed using at least one metal selected from a group consisting of tantalum, tungsten, nickel, molybdenum, tantalum silicon, tungsten silicon, titanium silicon, molybdenum silicon and nickel silicon such that the work function of the first gate conductive layer becomes about 4.0 eV to about 4.3 eV and the second gate conductive layer is formed using at least one metal selected from a group consisting of titanium, titanium nitride, tungsten, nickel, tungsten silicon, titanium silicon, molybdenum silicon, nickel silicon, ruthenium, ruthenium oxide, iridium, iridium oxide and platinum such that the work function of the second gate conductive layer becomes about 4.7 eV to about 5.0 eV.

4. The complementary metal-oxide-semiconductor transistor of claim 1, wherein the lower first gate conductive layer is formed using at least one metal selected from a group consisting of tantalum, tungsten, nickel, molybdenum, tantalum silicon, tungsten silicon, titanium silicon, molybdenum silicon and nickel silicon such that the work function of the lower first gate conductive layer becomes about 4.0 eV to about 4.3 eV, the lower third gate conductive layer being formed using at least one metal selected from a group consisting of titanium, titanium nitride, tungsten, nickel, tungsten silicon, titanium silicon, molybdenum silicon, nickel silicon, ruthenium, ruthenium oxide, iridium, iridium oxide and platinum such that the work function of the lower third gate conductive layer becomes about 4.7 eV to about 5.0 eV, and the upper first and third gate conductive layers including at least one material selected from a group consisting of tantalum nitride, tungsten nitride, nickel nitride, tantalum silicon nitride, tungsten silicon nitride, titanium silicon nitride, molybdenum silicon nitride, nickel silicon nitride, ruthenium nitride, ruthenium oxynitride, iridium nitride, iridium oxynitride and platinum nitride.

* * * * *